(12) United States Patent
Monadgemi et al.

(10) Patent No.: US 9,008,139 B2
(45) Date of Patent: Apr. 14, 2015

(54) STRUCTURE AND METHOD FOR EDGE-EMITTING DIODE PACKAGE HAVING DEFLECTORS AND DIFFUSERS

(71) Applicant: JDS Uniphase Corporation, Milpitas, CA (US)

(72) Inventors: Pezhman Monadgemi, Fremont, CA (US); Vincent V. Wong, Los Altos, CA (US); Prasad Yalamanchili, Santa Clara, CA (US); Reddy Raju, Fremont, CA (US); Erik Paul Zucker, Los Altos, CA (US); Jay A. Skidmore, San Jose, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 0 days.

(21) Appl. No.: 13/930,879

(22) Filed: Jun. 28, 2013

(65) Prior Publication Data

US 2015/0003482 A1    Jan. 1, 2015

(51) Int. Cl.
*H01S 5/22*    (2006.01)
*H01S 5/022*    (2006.01)
(Continued)

(52) U.S. Cl.
CPC ......... *H01S 5/02292* (2013.01); *H01S 5/02216* (2013.01); *H01S 5/02296* (2013.01); *H01S 5/4056* (2013.01); *H01S 5/0201* (2013.01)

(58) Field of Classification Search
CPC .............. H01S 5/0201; H01S 5/02216; H01S 5/02292; H01S 5/02296; H01S 5/4056; H01S 5/4075
USPC .................. 372/44.01, 50.124; 438/25, 27
See application file for complete search history.

(56) References Cited

U.S. PATENT DOCUMENTS 5,100,220 A      3/1992  Voegeli ........................... 385/14
5,479,426 A *  12/1995  Nakanishi et al. ........... 372/50.1
(Continued)

FOREIGN PATENT DOCUMENTS

EP          0445488 A1      9/1991      ................ H01S 3/25
WO      2012044011           4/2012      .............. H01L 33/48

OTHER PUBLICATIONS

JDSU Optical 3D Gesture Recognition (accessed May 28, 2013) http://www.jdsu.com/en-us/Custom-Optics/applications/gesture-recognition/Pages/optical-3d-gesture-recognition-and-jdsu.aspx.
(Continued)

*Primary Examiner* — Yuanda Zhang
*Assistant Examiner* — Michael Carter
(74) *Attorney, Agent, or Firm* — JDS Uniphase Corporation

(57) ABSTRACT

A high field of view, low height package and wafer-level packaging process are provided. The top surface of a first wafer has recesses defined by sidewalls, with a reflector, and a floor. The reflector is incident a horizontal light path form an edge-emitting diode on the floor, directing the light path vertically. A second optically diffusing wafer receives the vertically directed light. A vertical ring to surround each recess is wafer-level fabricated on one of the wafers. The vertical ring may have a high aspect ratio to increase light diffusion. The second wafer is connected above the first such that each vertical ring encloses its corresponding recess and such that the light vertically exits the optically diffusing media after spanning the height of the vertical ring. Diode electrical connections are provided for externally controlling the diode. Individual packages are separated by double-dicing the connected wafers between the recesses.

21 Claims, 13 Drawing Sheets

(51) Int. Cl.
*H01S 5/40* (2006.01)
*H01S 5/02* (2006.01)

(56) References Cited

U.S. PATENT DOCUMENTS

| | | | | |
|---|---|---|---|---|
| 5,671,243 | A | * | 9/1997 | Yap .............................. 372/50.23 |
| 5,981,945 | A | * | 11/1999 | Spaeth et al. ................. 250/239 |
| 6,588,949 | B1 | * | 7/2003 | Zhou ................................. 385/94 |
| 6,970,491 | B2 | | 11/2005 | Bhandarkar ............... 372/43.01 |
| 6,998,691 | B2 | | 2/2006 | Baugh et al. .................. 257/433 |
| 7,223,619 | B2 | | 5/2007 | Wang et al. ...................... 438/26 |
| 7,245,645 | B2 | | 7/2007 | Behfar et al. ................. 372/50.1 |
| 7,450,621 | B1 | | 11/2008 | Tallone et al. ............. 372/43.01 |
| 7,535,949 | B2 | | 5/2009 | Wang et al. .................... 372/101 |
| 7,592,638 | B2 | | 9/2009 | Kim ................................. 257/98 |
| 7,949,023 | B2 | | 5/2011 | Yoshikawa ...................... 372/36 |
| 8,315,287 | B1 | | 11/2012 | Roggero et al. ........... 372/50.11 |
| 8,369,913 | B2 | | 2/2013 | Nomoto et al. ................ 600/310 |
| 2005/0123016 | A1 | * | 6/2005 | Behfar et al. .................... 372/50 |
| 2011/0158273 | A1 | * | 6/2011 | Okayama et al. .......... 372/43.01 |
| 2013/0022069 | A1 | | 1/2013 | Lee et al. .................... 372/38.02 |
| 2013/0272329 | A1 | * | 10/2013 | Auen et al. ...................... 372/34 |

OTHER PUBLICATIONS

High-Reliatability Diode Lasers for Gesture Recognition (accessed May 5, 2013) http://www.jdsu.com/productliterature/hr-diode-laser-gesture-recogn-an-cl-ae.pdf.

ReverseEngineering 3D Packaging Aug. 2012 Web-3 (accessed May 27, 2013) http://www.i-micronews.com/upload/pdf/ReverseEngineering_3D%20Packaging_August2012_Web-3.pdf.

* cited by examiner

STRUCTURE AND METHOD FOR EDGE-EMITTING DIODE PACKAGE HAVING DEFLECTORS AND DIFFUSERS

TECHNICAL FIELD

The present disclosure relates to wafer-level packaging of edge-emitting laser diodes with deflectors and diffusers within the package. More particularly, the present disclosure relates to such laser diode packages having a high optical field of view with a small height profile.

BACKGROUND

Consumer electronics are decreasing in size and increasing their use of laser diodes that emit into the environment. For example, 3D gesture recognition applications of high field of view near infrared laser diodes are appearing within consumer devices such as televisions, tablets and mobile devices. It would be advantageous to decrease the size of laser diode packages to allow them to be more easily included in such devices.

Wafer level Packaging (WLP) is a process for packaging a die, chip, integrated circuit (IC) or other semiconductor device using wafer level processing techniques to fabricate a plurality of packages in each wafer then separate the individual packages. Wafer level packaging is distinct from chip level packaging because the WLP process is applied to a plurality of packages simultaneously on a wafer or wafers while chip level packaging processes are applied to each chip or package individually.

Chip level packaging can occur on wafers, for example individually placing, aligning and attaching a component for each chip or package on the wafer. This is not considered wafer-level packaging because the placing, aligning and attaching process must be repeated for each component for each package instead of managing the placing, alignment and attaching of all copies of the component simultaneously.

An example of a chip level packaging process for edge-emitting laser diodes is described in U.S. patent publication 2013/0022069 published Jan. 24, 2013 in the name of Lee et al., owned by the present Applicant, and incorporated herein by reference for all purposes. In Lee et al., the reflective sidewalls and optical elements such as a diffuser or lens are individually aligned and secured for each package.

Attachment of optical components, such as diffusers, at the chip level has been in practice for some time; however, individually aligning and attaching components of each package is costly, time consuming, and prone to misalignments due to the nature of manual dispensing. Generally, costs decrease when more steps of the packaging process and more components of the package can be fabricated and attached in bulk at the wafer-level rather than individually at the chip level. It would be advantageous to reduce the use of chip level processing of components when producing vertically turned edge-emitting laser diode packages.

An example of a wafer level packaging process for edge-emitting laser diodes is described in U.S. Pat. No. 6,998,691 issued Feb. 14, 2006 to Baugh et al. and incorporated herein by reference for all purposes. In Baugh et al., a cap wafer includes a plurality of caps, each being a cavity containing a reflector. An optically transparent submount wafer includes a plurality of submounts, each having an attached laser diode, electrical traces and vias connecting the diode to external terminals and a focusing lens. The cap wafer is attached above the submount wafer such that each laser diode is contained within a cavity. Horizontally emitted light from the edge-emitting laser diode reflects off the cap's reflector and passes vertically down through the lens and the transparent submount to exit the package. However, the submount in Baugh et al. is complex to fabricate because it must provide electrical connectivity for the emitter outside the package, it must secure the emitter within the package, and it must provide optical transmission through the submount and out of the package. According to Baugh et al., the submount wafer is predominantly transparent to light from the laser diode making the submount a particularly expensive component of the package. Furthermore, the lens or other optical elements in the submount focus the emitted light, such as for fiber optic transmissions and do not address the problem of distributing light over a large field of view.

The present disclosure seeks to overcome some of the disadvantages of the prior art.

SUMMARY

The present disclosure teaches vertically reflected edge-emitting laser diode packages and wafer level processes to make the same. The process joins a transparent diffuser wafer substrate comprising etched or patterned polymer features to a recessed submount substrate comprising laser diodes and deflectors within each recess. Elevation structures that are part of, or formed on, one of the wafers assist to define cavities between the wafers surrounding and containing each recess and its deflectors and laser diode. Using this process, a multitude of horizontally emitting laser diodes can be integrated into packages having electrical connections and vertically turning and diffusing optics fabricated at the wafer level to lower manufacturing cost compared to packaging processes requiring more chip-level component alignment and attachment. Embodiments of the present disclosure are based on generating elevation structures comprising high aspect ratio pillars or vertical rings surrounding the cavity periphery to create a continuous fence-like structure, followed by low temperature bonding.

An aspect of the present disclosure provides a structure comprising a thermally conducting substrate having a recess defined in a top surface by sidewalls and a floor. An edge-emitting diode is disposed in the recess and attached to the conducting substrate's floor. The diode has a horizontal light path incident to at least one portion of the conducting substrate's sidewalls. The at least one portion has slope relative to the horizontal light path and includes a reflective surface for directing the light path vertically. An optically transparent diffusing substrate has a bottom surface and is aligned on the vertically directed light path. A continuous vertical ring is formed by a wafer level processing technique on the bottom surface of the diffusing substrate or on the top surface of the conducting substrate. The conducting substrate and the diffusing substrate are connected together with the vertical ring there between surrounding the recess and thereby defining a cavity bounded by the diffusing substrate's bottom surface, inner walls of the vertical ring and the conducting substrate's sidewalls, floor and top surface. The cavity includes the recess. An electrical connection to the diode is provided from outside the cavity for controlling the diode.

Another aspect of the present disclosure provides a process comprising: (a) providing a first substrate having a recess in a top surface defined by sidewalls and a floor; (b) applying a reflector to a portion of the sidewalls; (c) attaching an edge-emitting diode to the floor such that a horizontal light path from the diode will be incident to the reflector directing the light path vertically; (d) providing a second substrate having a bottom surface and comprising an optically diffusing media; (e) fabricating a vertical ring on one of the first substrate's top surface surrounding the recess and the second substrate's bottom surface in a position to surround the recess; (f) providing an electrical connection to the diode from outside the vertical ring for controlling the diode; and (g) after (a) through (f), connecting the second substrate above the first substrate such that the vertical ring encloses the optically diffusing media and the recess and such that the vertically turned light path is incident to the optically diffusing media.

A further aspect of the present disclosure provides a process comprising: (a) providing a first substrate wafer having a plurality of recesses in a top surface, each recess defined by sidewalls and a floor; (b) applying a reflector to a portion of the sidewalls of each recess; (c) securing an edge-emission diode to each floor such that a horizontal light path from each diode is incident to the reflector of its corresponding recess directing the light path vertically; (d) providing a second substrate wafer having a bottom surface and comprising an optically diffusing media; (e) fabricating a vertical ring for each recess on one of the first wafer's top surface surrounding its corresponding recess and the second wafer's bottom surface in a position to surround its corresponding recess; (f) providing an electrical connection to each diode from outside the vertical ring for controlling the diode; (g) after (a) through (f), connecting the second wafer above the first wafer such that each vertical ring encloses its corresponding diffusing optical media and its corresponding recess and such that each vertically turned light path is incident to its corresponding diffusing optical media; (h) after (g), separating packages by cutting the connected wafers between the recesses.

DESCRIPTION OF THE DRAWINGS

Embodiments of the present disclosure are described with reference to the following figures. In these figures, the size and proportions of various features are not drawn to scale.

DETAILED DESCRIPTION

While preferred embodiments may be illustrated or described, they are not intended to limit the invention. Rather, numerous changes including alternatives, modifications and equivalents may be made as would be understood by the person skilled in the art.

The present disclosure describes wafer-level package structures and wafer-level packaging processes for a multitude of edge-emitting lasers together with light deflectors and light diffusers. In some embodiments, the wafer-level structures and processes join a diffuser wafer comprising etched or patterned polymer features in an optically transparent substrate, to a silicon platform comprising laser diodes, deflectors and submounts. In these embodiments, a multitude of laser diodes along with associated optical components can be integrated at wafer-level to lower manufacturing cost compared to packages manufactured using chip-level processing techniques. The multitude of laser diodes are mounted on horizontal surfaces to limit the vertical profile of the packages. A reflective sidewall can redirect the output emission from the edge-emitting laser along the vertical direction through the optical media, such as a diffuser or lens. The wafer-level package structures and processes according to the present disclosure can provide high Field-of-View light emissions in a small vertical footprint (or z-profile) that is typically less than about 5 mm and in some embodiments less than about 1 mm. In some embodiments, the field of view that can be achieved is between about 30° and about 60° in both horizontal and vertical axes. For example, the laser diode package of an XBOX Kinect (™s of Microsoft) is 57° horizontally by 43° vertically.

Figure 1:
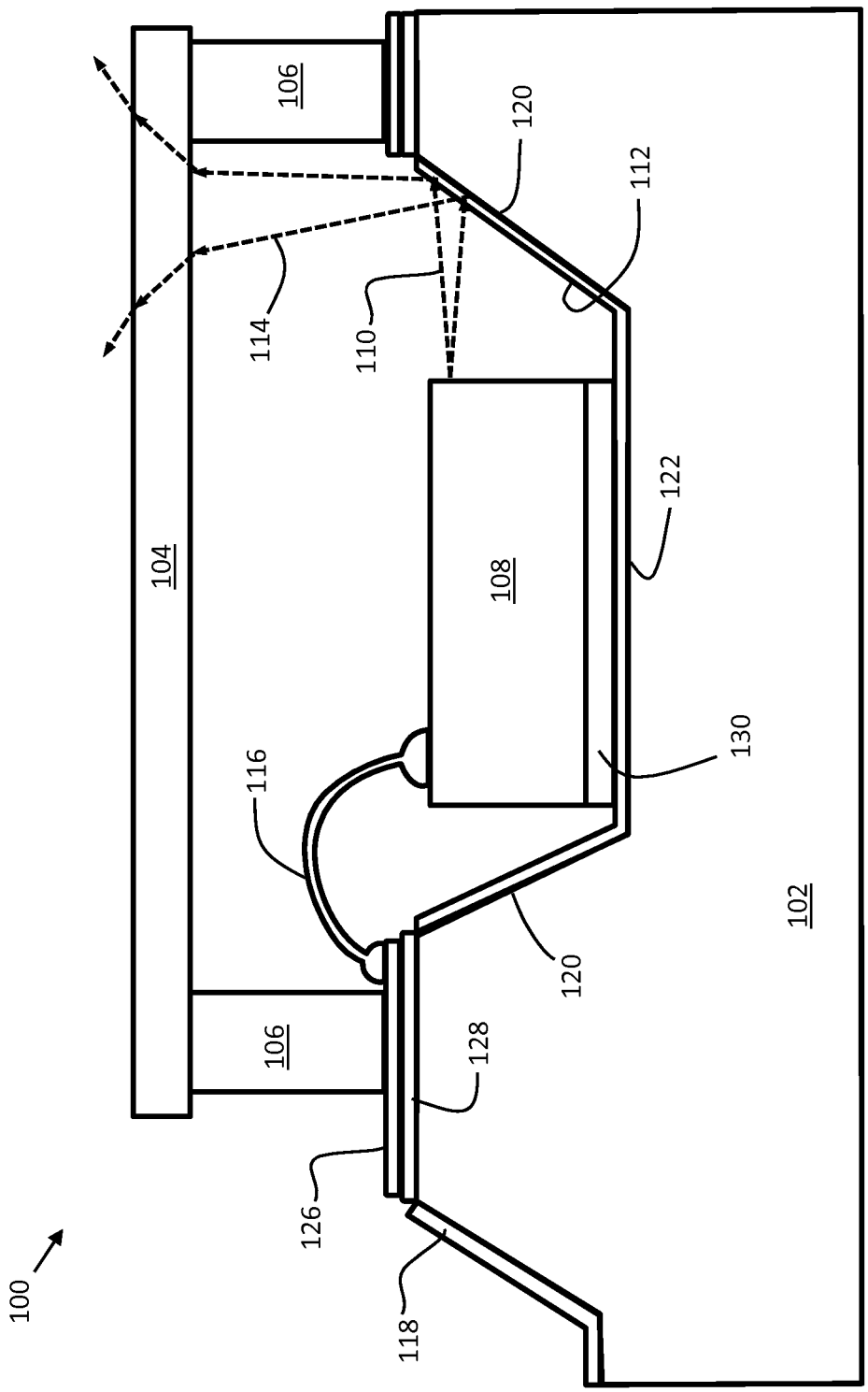
FIG. 1 is a cross-sectional side view of a laser diode package according to the present disclosure.

Referring now to FIG. 1, a cross-sectional side view of a laser diode package 100 according to the present disclosure is illustrated. The laser diode package 100 is one of a plurality of packages created in a wafer-level process forming a multi-layer wafer that is separated into individual packages 100. Unless indicated otherwise, all processing of the wafers and the laser diode packages 100 is performed at the wafer-level using wafer level techniques such as electroplating, evaporation, sputtering, molding, screen printing, spin or spray coating, laminating, chemical vapor deposition, epitaxy, dispensing, selective crystallographic etching and other techniques as known in the art.

The laser diode package 100 comprises an electrically conducting substrate 102 and an optically transparent substrate 104. A continuous vertical ring 106 is formed by a wafer-level processing technique on the bottom surface of the optical substrate 104 or on the top surface of the conducting substrate 102. A laser diode 108 is connected to the conducting substrate 102 within the vertical ring 106 for emitting light along a horizontal light path 110. A deflector or reflector 112 redirects the horizontal light path 110 vertically into a vertical light path 114. The vertical light path 114 is incident to, and passes through, the optically transparent substrate 104 such that light from the horizontally emitting diode laser 108 is emitted vertically from the package 100. Electrical connections 116, 118 electrically control the diode 108 from outside of the vertical ring 106 and outside package 100.

The conducting substrate 102 comprises any thermally conducting wafer substrate, such as a semiconductor and is formed from materials such as crystalline silicon, germanium, silicon germanium, silicon carbide, gallium arsenide, indium phosphide and others as known in the art. The substrate 102 is thermally conducting to ensure adequate heat dissipation through the package. The thermally conducting substrate 102 may form part of one of the electrical connections 116, 118 between the laser diode 108 and the exterior of the package 100. In each package 100, the conducting substrate 102 provides a recess within which at least a portion of the laser diode 108 resided. The recess is defined in the top surface of the conducting substrate wafer 102. The recess in the conducting substrate 102 defines sidewalls 120 surrounding a floor 122. The recess may be any depth and shape to house enough of the height of the laser diode 108 such that the horizontal light path 110 from the laser diode 108 will be incident to the reflector 112 disposed on at least one portion of the sidewalls 120. The depth of the recess reduces the thickness of the package 100 but also reduced the thickness of the conducting substrate 102 which may cause additional problems discussed later.

Figure 2:
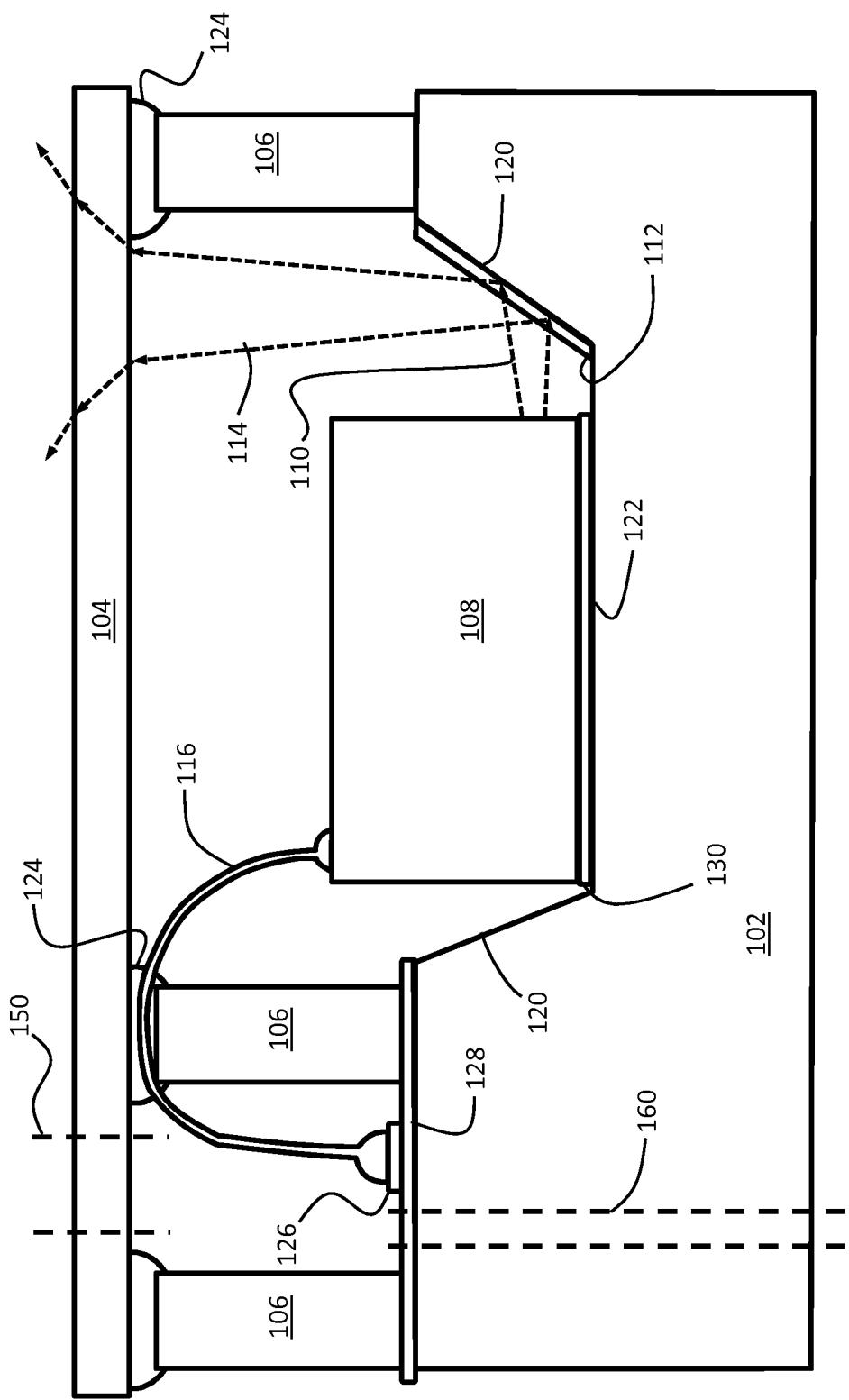
FIG. 2 is a cross-sectional side view of a cutting procedure for a multi-layer wafer of laser diode packages according to the present disclosure.

The recesses have a minimum depth that is greater than the emitting height of the laser diodes 108. In FIG. 1, the recess has a depth that is approximately equivalent to the height of the laser diode 108; however the recess may contain only a portion of the height of the laser diode 108, such as illustrated in FIG. 2. The recess depth and the length of the floor of the recess also contribute to the dispersion of light along the light paths 110, 114 as will be discussed later in greater detail.

The floor 122 is generally a horizontal surface to simplify fabrication of the conducting substrate 102 and attachment of the laser diode 108.

The sidewalls 120 may be a single continuous sidewall, for example where the recess has a circular shape or a collection of joined sidewalls portions. At least one portion of the sidewalls 120 has a slope relative to the horizontal light path 110 and includes a reflective surface 112 for directing the light path vertically. The sidewall slope may be constant or varied, such as a convex or concave surface. The sidewalls 120 may be angled or curved to provide the reflector 112 with the necessary slope or slopes to redirect the horizontal light path 110 into the vertical light path 114. Portions of the sidewall 120 that are not used for reflecting the light path 110 may have any slope convenient for forming the recess in the conducting substrate 102.

In some embodiments, a conducting substrate 102 comprises silicon pre-cut so that the surface plane is 9.7° off [100] plane. This facilitates using selective crystallographic etching to define the recess having 45° sloped sidewalls 120 and a horizontal submount floor 122. A portion of the sidewalls 120 may then be polished or coated to provide a reflector 112 that can vertically turn the horizontal light path 110.

The reflector 112 redirects or reflects light from the horizontal light path 110 to the vertical light path 114 so light can pass vertically through the optically transparent substrate 104. The reflector 112 may comprise a reflective surface of sidewall 120 of the conducting substrate 102. The reflector 112 may comprise a gold or silver coating or other highly reflective material that readily withstands high power light from the laser diode 108.

Figure 4:
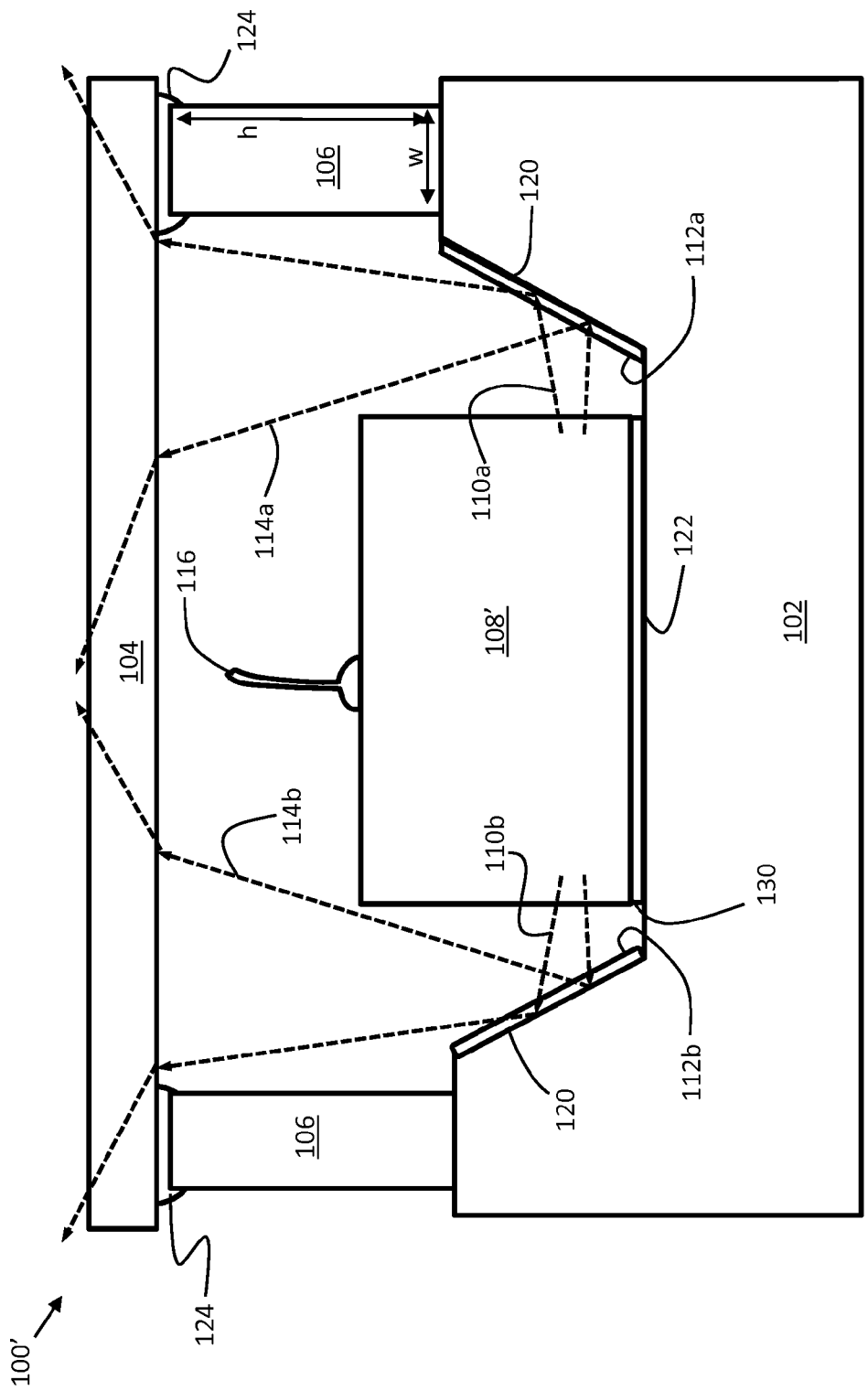
FIG. 4 is a cross-sectional side view of a symmetric laser diode package according to the present disclosure.

As illustrated in FIG. 1, a reflector 112 may be coated into the recess prior to attaching the laser diode 108 to the floor 122. Alternately, the reflector 112 may be applied to a portion of a sidewall 120 as illustrated in FIG. 2 either before or after mounting the laser diode 108. In FIG. 4, two reflectors 112a, 112b are provided to redirect symmetric horizontal light paths 110a, 110b as vertical light paths 114a, 114b respectively. In some embodiments, the reflector 112 may be deposited with a constant thickness from about 50 nm to about 5 um. Although illustrated as having the same slope as the sidewall 120, the reflectors 112, 112a, 112b may have an independent slope or curving as desired for optical shaping of the vertical light paths 114, 114a, 114b and as reasonably achievable using wafer-level techniques. For example, the reflector 112 may be deposited in varying thickness on a sidewall 120, and the reflector 112 have a convex surface to increase dispersion of the vertical light path 114. A curved reflective surface 112 may be used to collimate light, to decrease divergence, or to further scatter the light increasing divergence.

The laser diode 108 comprises an edge-emitting laser diode. The diode 108 emits light along one or more horizontal light paths 110 as illustrated in FIG. 1 and horizontal light paths 110a, 110b as illustrated in FIG. 4. The laser diode 108 is disposed on the floor 122 of the recess of the conducting substrate 102. As illustrated in FIG. 1, the laser diode 108 may be offset from the center of the floor 122. This increases the propagation distance (D in FIG. 11) between the edge-emitting surface of the diode 108 and the reflector 112. Increasing the propagation distance D can assist to disperse light and to reduce the concentration of light on the reflector 112 to reduce the risk of damaging the reflector 112.

The laser diodes 108 are mounted on the floor 122 within the recess of the conducting substrate 102. The laser diodes 108 are aligned and attached on the floor 122 in a p-side up or down configuration. For example, the laser diodes 108 may be joined to the conducting substrate 102 by eutectic solder-gold bonding at 280-320° C. or solder reflow at 240-280° C. These methods provides advantageous thermal dissipation compared to methods using less thermally conductive materials such as epoxies. Other connecting techniques may be applied as known in the art.

The laser diodes 108 are mounted within the recess to limit the vertical height or z-profile of the package 100. The laser diodes 108 are disposed in the recesses such that the horizontal light paths 110 are incident to at least one portion of the sidewalls 120 of each recess where a reflector 112 is provided. Unlike the other steps in the packaging process, each laser diode 108 is individually aligned and attached to the floor 122 of each recess in the conducting substrate wafer 102 using chip-level techniques. For example, pick and place machines can perform alignments of each laser diode 108 with alignment marks on the conducting wafer 102.

A continuous vertical ring 106 formed by a wafer level processing technique is also provided. The vertical ring 106 is a fence-like structure or pillar that will circumscribe and surround the recess. It is continuous in that is circumscribes and surrounds the recess to aid in hermetically sealing the package 100. The ring 106 may have any shape when viewed from the top or bottom so long as the ring surrounds the recess when the two substrates 102, 104 are joined. The vertical ring 106 extends the distance between the point of redirection of the horizontal light path 110 by the reflective surface 112 and the point of entry of the vertical light path 114 to the optically transparent substrate 104. This distance increases the dispersion of light but can also increase the risk of internal interference and unwanted reflections discussed in greater detail below.

The vertical ring 106 is formed on the bottom surface of the optically transparent substrate 104 or on the top surface of the conducting substrate 102. To reduce reliance on chip-level processing techniques, the vertical rings 106 are not separate components that must be individually aligned and attached to the package 100; rather, the vertical rings are formed on either of the substrates 102, 104 by wafer-level techniques. For example, the vertical rings 106 may be fabricated by any reasonable combination of evaporation, sputtering, plating, molding, screen printing, spin or spray coating, chemical vapor deposition, epitaxy, laminating, dispensing and selective crystallographic etching.

In some embodiments, the vertical rings 106 may require a high height-to-thickness aspect ratio which can be difficult to achieve using wafer-level techniques. In some embodiments, the vertical rings 106 have a thickness (w in FIG. 1) from 1 um to 1 mm and a height (h in FIG. 1) from 1 um to 1 mm.

For example, if the desired field of view of the package 100 requires a 600 um working distance between the edge of the emitter diode 108 and the bottom surface of the optically transparent substrate 104, a vertical ring 106 can be generated that has a cross-section that is 200 um wide and 600 μm tall. This ring 106 has an aspect ratio of 3:1 which cannot readily be generated by dispensing methods. To overcome this challenge, the vertical ring 106 can be formed by spin/spray coating or laminating thick (100 μm-600 μm) polymer (such as SU8 negative photoresist from Microchem), or by molding. In spin or spray methods, thick layers of viscous polymer can be applied by single or multiple coatings, followed by curing to remove liquid components and leave a solid material. Then a pattern is transferred by exposing the wafer to ultraviolet light through an optical mask. Finally, the exposed or non-exposed portion of the polymer is removed in an alkaline liquid. In the molding method, a pre-molded structure covering the entire wafer, can be applied to the wafer through a tape or cast by applying pressure and heat. Alternatively, the pre-molded structure can be bonded to the wafer using an adhesive material.

Low temperature bonding can be applied as the vertical rings 106 are formed. Polymer can be cured from 90° C. up to 350° C. and overmold can be cured from 150° C. to 200° C., which is below the melting point of AuSn which may already be in use securing other components to the substrate 102, 104. It is desirably to be able to bond and cure the vertical ring 106 at low temperatures to avoid damaging any other components already in the partially constructed substrate 102, 104 on which the vertical rings 106 are beings formed. For example, the attachment of the laser diode 108 to the floor 122 (which may include an AuSn die attach) may occur prior to forming the vertical rings 106 on the conducting substrate 102.

Where other features are applied on top of the conducting substrate 102 such as electrical bond pads and insulators as shown in FIG. 1, the vertical ring 106 may be formed on top of those layers.

The optically transparent substrate 104 provides an optical medium through which the vertical light path 114 passes to exit the package 100 imparting the desired field of view to the emitted light. The optically transparent substrate 104 may be a diffuser wafer comprising an optically diffusing media such as a glass, sapphire, plastic or polymer material and may comprise etched or patterned polymer features to promote diffusion of light. The optically transparent substrate 104 may also comprise an opaque substrate having diffusing optical elements disposed through the opaque substrate and aligned on the vertical light paths 114; however this may be more complex and expensive to manufacture. The optical elements may include a diffuser or a lens. The optically transparent substrate 104 has a bottom surface through which the vertical light path 114 passes and on which the vertical rings 106 may be formed or may be bonded from the conducting substrate 102.

Figure 5:
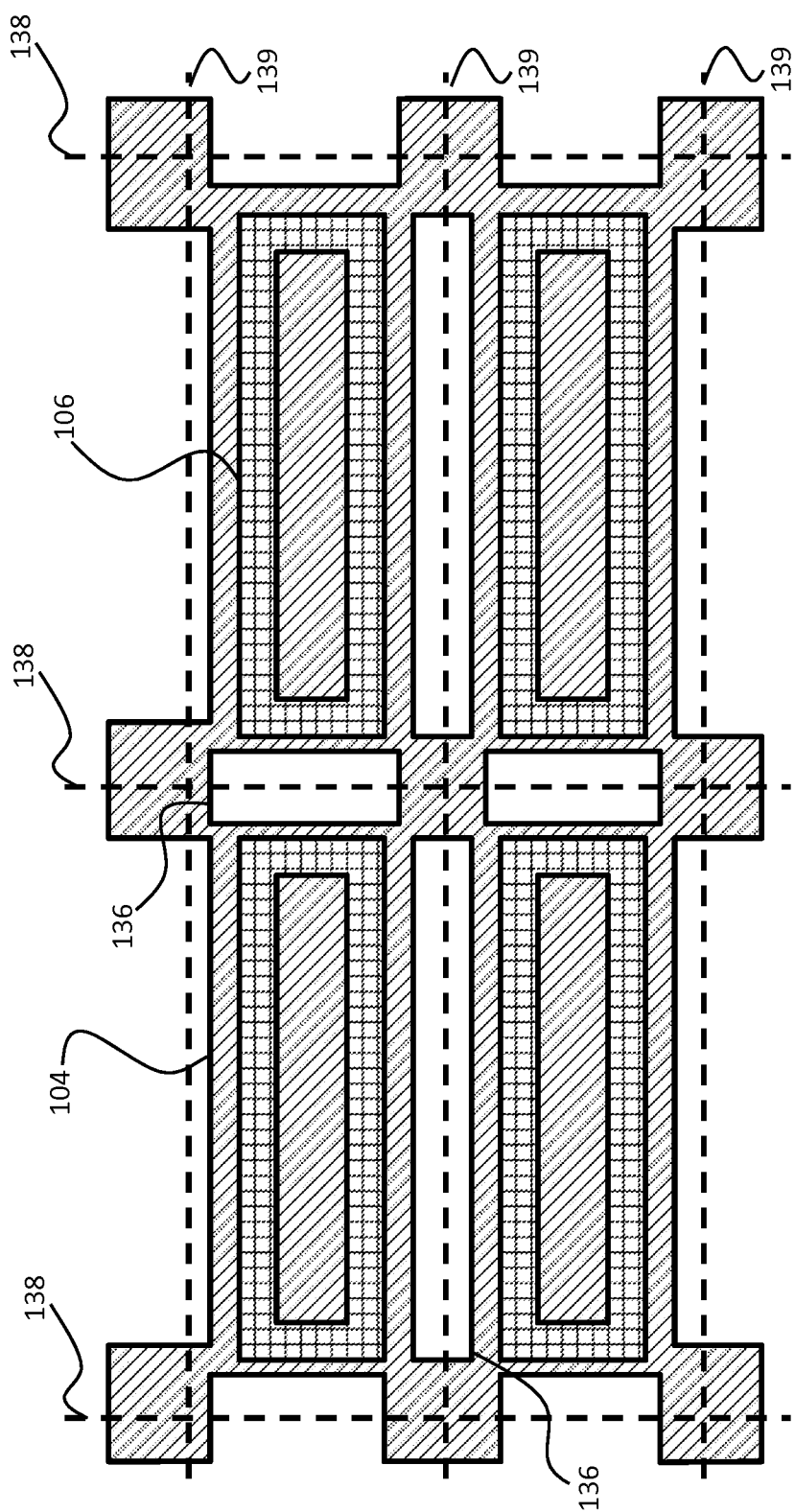
FIG. 5 is a bottom view of an optical substrate having vertical rings and through holes.

Referring to FIG. 5, a bottom view of an optically transparent substrate 104 is illustrated. Continuous vertical rings 106 are formed on the bottom surface of the substrate 104 in such a manner that they will surround a corresponding recess of the conducting substrate 102 when aligned and bonded with that wafer. Through-holes 136 are cut through the optically transparent substrate 104 to assist in separating individual packages 100 by reducing the volume of material that must be cut after the wafers 102, 104 are bonded together. FIG. 5 illustrates the cutting lines 138, 139 for singulation of packages 100 from the bonded wafers. The through-holes 136 also permit access to the bonding joints for each package between the two wafers 102, 104. In some embodiments, rather than through-holes 136, the areas where the through-holes 136 are located may instead have reduced thickness to facilitate cutting or allow backgrinding instead of cutting.

Returning to FIG. 2, bonding of the conducting substrate 102 and the optical substrate 104 is now described. The optical wafer 104 is brought in proximity of the vertical rings 106 which were formed on the conducting substrate 102. The optical wafer 104 is aligned and joined to the vertical rings 106 using an adhesive 124. The adhesive 124 (such as thermally or optically curable epoxy) is applied by screen printing, dispensing or spin-coat-transfer between the vertical ring 106 and the substrate that does not include the vertical ring 106. Depending on which substrate 102, 104 the vertical ring 106 is formed on, the adhesive may be applied to the bottom surface of the optically transparent substrate 104, a top surface of the vertical ring 106, the top surface of the conducting substrate 102 or a bottom surface of the vertical ring 106.

Where other features are applied on top of the conducting substrate 102 such as electrical bond pads or insulators as shown in FIG. 1, the adhesive may be applied to the upper most of those layers.

Screen print glass frit requires a large keep out area between the edge of the package and the bond pads, increasing the size of the package 100. Glass frit bonding also requires temperatures above 400° C., which is considered high for solder joints making this a less desirable method of joining the wafers.

Polymer and mold provide a near hermetic package 100. A pre-bake prior to joining the substrates 102, 104 can help diffuse out any moisture and residual gasses.

Once the conducting substrate 102 and the optical substrate 104 are joined with the vertical ring 106 there between, an internal cavity is formed within each package 100. The cavity includes the recess of the conducting substrate and encloses the laser diode 108 within each package 100 in the bonded multi-layer wafer. The cavity is bounded by the optical substrate's bottom surface, the vertical ring's inner walls and the conducting substrate's sidewalls, floor and top surface. The cavity may be hermetically sealed during the bonding process or there may be additional steps after joining the substrates 102, 104 to hermetically seal the cavity.

Electrical connection 116, 118 to the laser diode 108 from outside the cavity are provided for controlling the laser diode 108. Any electrical connections can be provided as known in the art. A variety of different electrical connections are illustrated in the Figures. These examples are provided merely to illustrate some variety and without the intention to limit the possible electrical connections.

Figure 3:
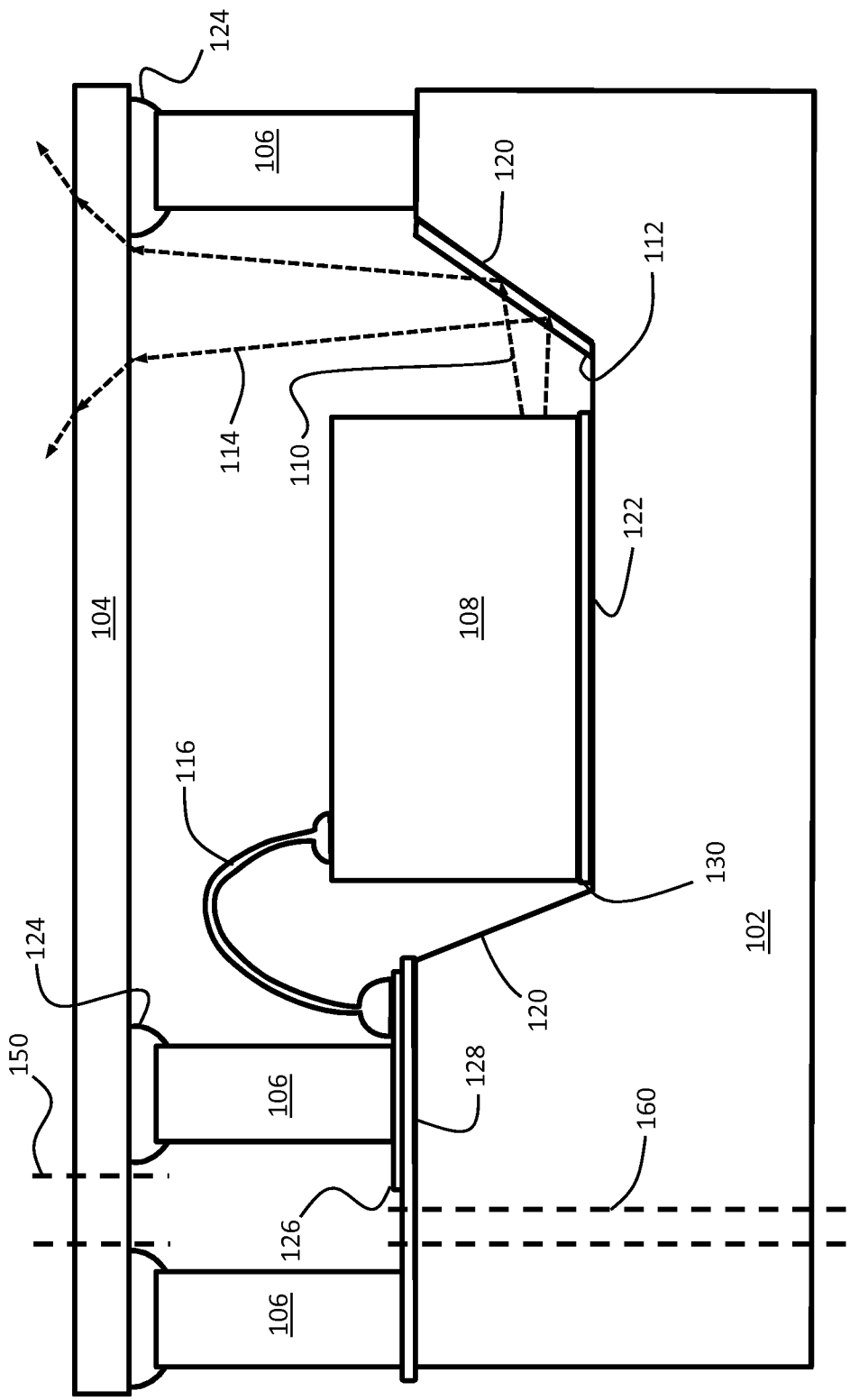
FIG. 3 is a cross-sectional side view of another multi-layer wafer of laser diode packages according to the present disclosure having alternate electrical connections for the laser diode.

In FIGS. 1 and 3, conventional wire bonds 116 connect the laser diodes 108 to electrical pads 126 spanning beneath the vertical ring 106 from inside the cavity to outside the package 100. An insulator 128 separates bond pads 126 from the conducting substrate 102. A second bond pad 118 provides electrical connection to the conducting substrate 102 which electrically connects to the laser diode 108 through the floor 122 and die attach 130. Metal feedthroughs can be used to provide horizontal electrical connection from inside the package 100 to the outside via electrical bond pads. This avoids having wire bonds passing through the adhesive 124 or pillars 106, however it increase parasitic capacitance.

In FIG. 2, an electrical connection to the laser diode 108 comprises a conventional wire bond 116 spanning from inside the cavity to outside the package 100 through the adhesive 124 between the optical substrate 104 and the vertical ring 106. The wire bond 116 crosses over the vertical ring 106. It may be buried under adhesives or placed into a notch inside the vertical ring 106. This wire bond connects to a bond pad 126 on an insulator 128 outside the vertical ring 106. The second electrical connection may be provided directly through the conducting substrate 102 and the die attach 130 or through metal feedthroughs (not illustrated). In FIG. 4, a symmetric package 100' includes a laser diode 108 with multiple horizontal optical paths 110a, 110b. Accordingly, the wire bonds are provided out of (or into) the plane of the cross-sectional illustration in FIG. 4 orthogonal to the horizontal optical paths 110a, 110b to reduce optical interference.

Figure 8:
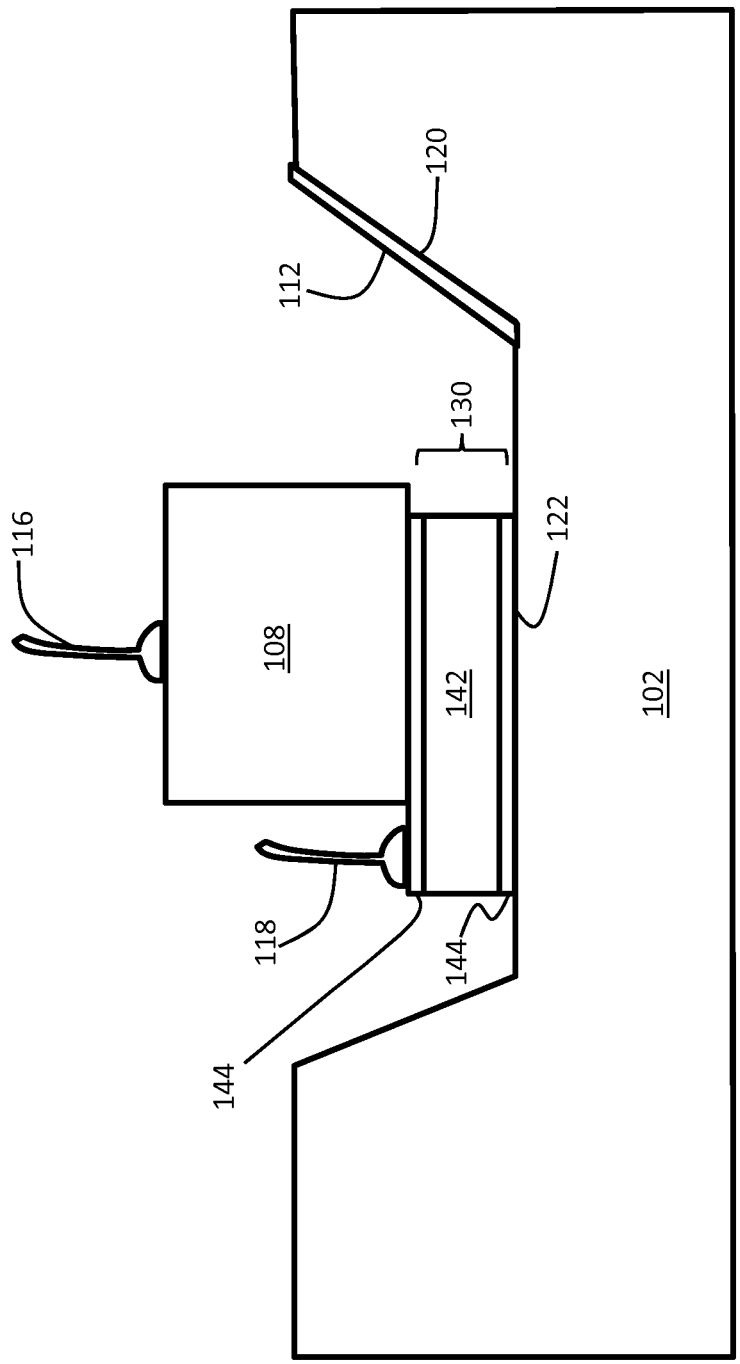
FIG. 8 is a cross-sectional side view of a laser diode package mitigating CTE mismatch according to the present disclosure.

In FIG. 8, the second electrical connection comprises a wire bond 118 connected directly to the solder 144 of die attach 130 instead of passing through the conducting substrate 102. Other electrical connections as known to the skilled person are within the scope of the present disclosure.

Figure 6:
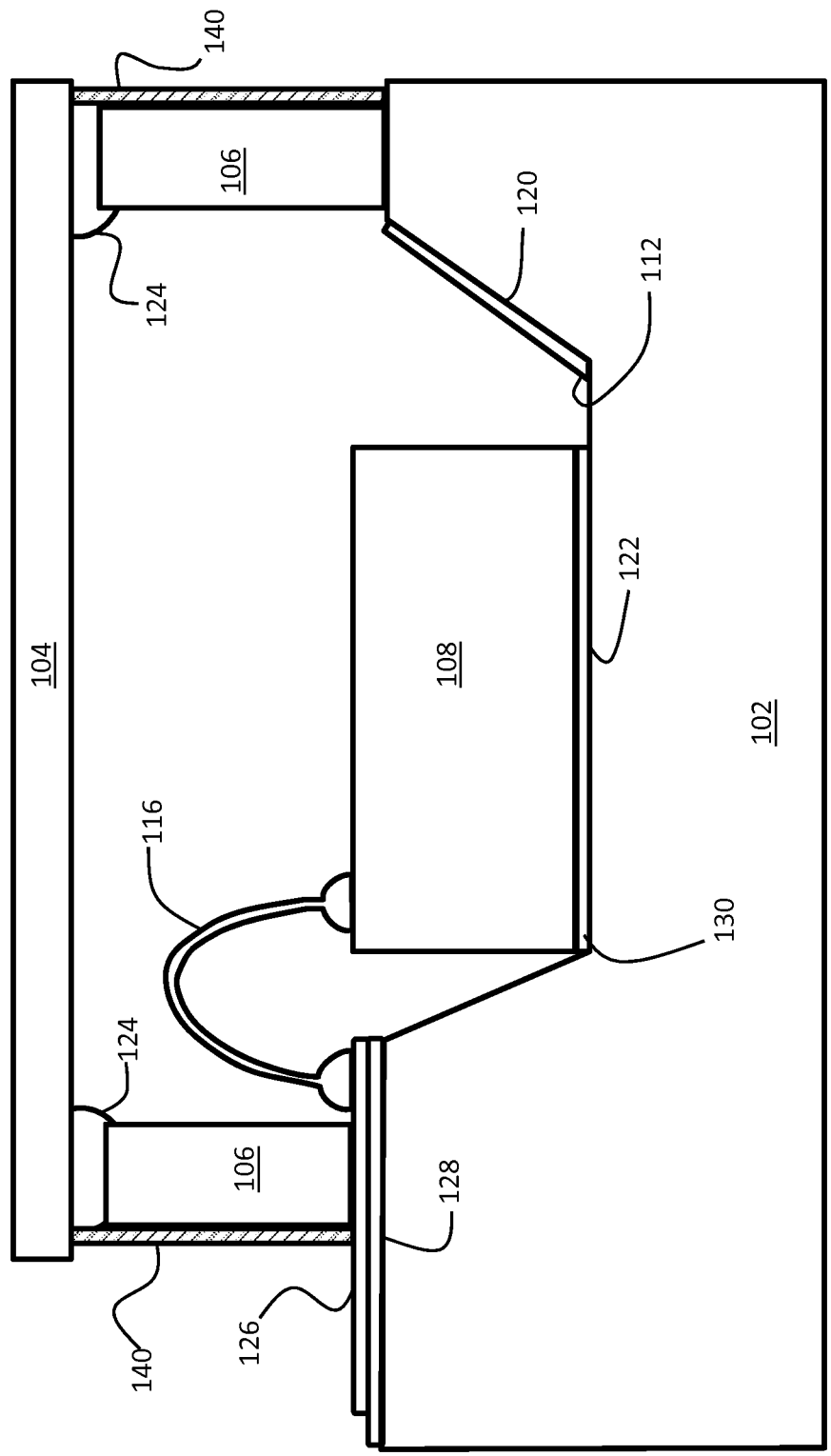
FIG. 6 is a cross-sectional side view of a laser diode package according to the present disclosure having a post-bonding hermetic coating.
Figure 7:
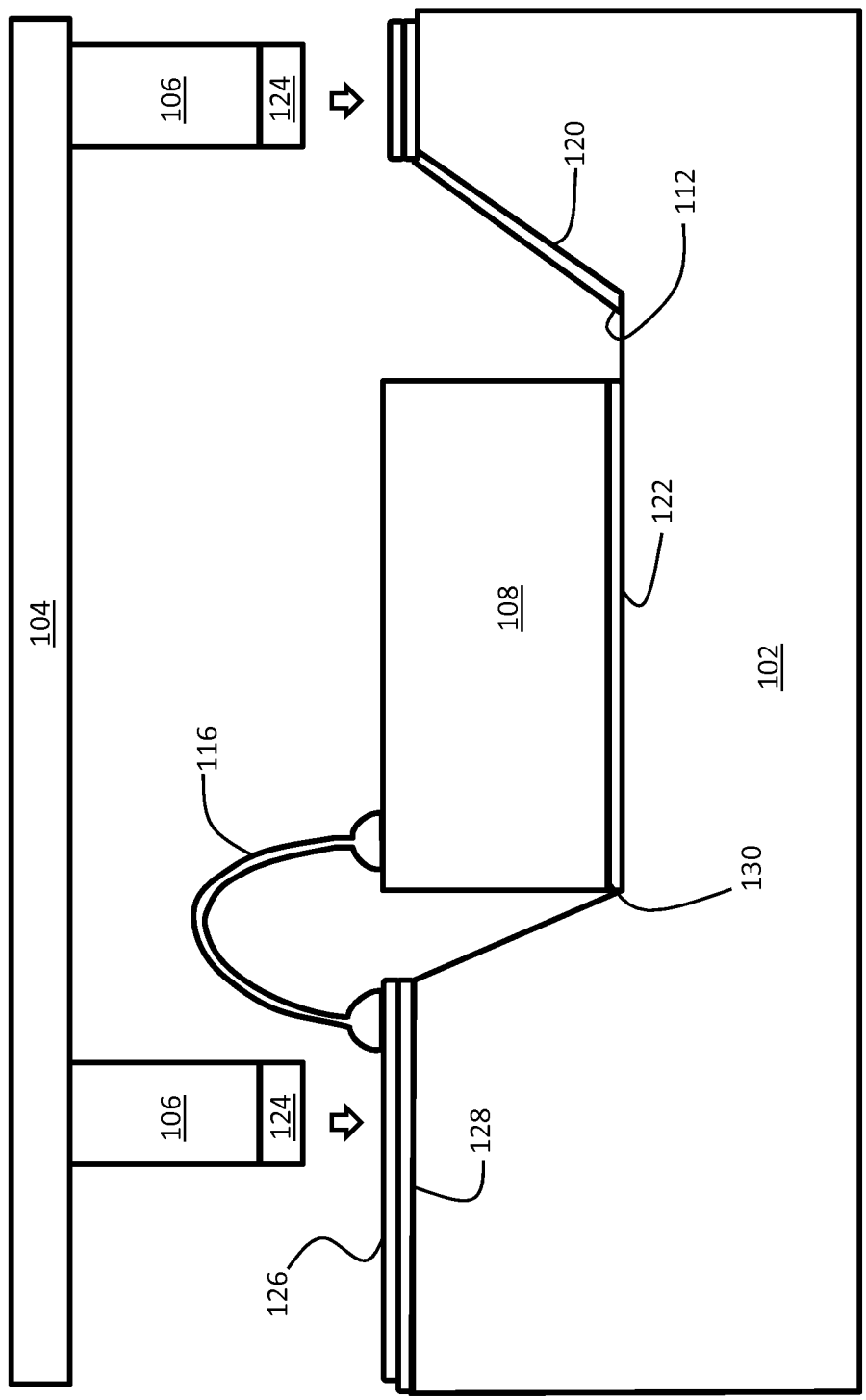
FIG. 7 is a cross-sectional side view illustrating hermetic wafer bonding of a substrate and another optical substrate according to the present disclosure.

Referring now to FIG. 6, a cross-sectional side view of a laser diode package 100 according to the present disclosure with a post-bonding hermetic coating 140 is illustrated. In order to provide hermeticity prior to singulation of the packages 100, it is possible to coat an organic or inorganic film 140 such as parylene, silicon oxide, or silicon nitride at temperatures below 200° C., followed by directional etching to leave a layer 140 on the exterior vertical side walls of the vertical ring 106. Another fully hermetic package 100 is illustrated in FIG. 7. In FIG. 7, a cross-sectional side view illustrates hermetic wafer bonding of a conducting substrate 102 and an optical substrate 104 according to the present disclosure. In FIG. 7, the vertical ring 106 comprises copper or solder pillars formed on the bottom of the diffuser wafer 104 by electroplating or evaporation, followed by eutectic bonding of a solder-gold adhesive 124 with the top surface of the conducting substrate 102. This method of forming vertical rings 106 for hermetic sealing is limited to diffusers 104 with no polymer features (only etched features or other non-polymer features) since polymer may not remain intact through the eutectic bonding temperatures. Access to the top surface of the conducting substrate 102 when bonding is possible via the through-holes 136 (see FIG. 5) outside the vertical rings 106. The eutectic bonding can be performed in a vacuum chamber, where moisture is pumped out, followed by purging nitrogen and backfilling with suitable gases.

Referring now to FIG. 8, a cross-sectional side view illustrates portions of a laser diode package related to mitigating CTE (coefficient of thermal expansion) mismatch according to the present disclosure. The difference in CTE between the GaAs of a laser diode 108 and the silicon of a conducting substrate 102 may cause normal and shear stresses potentially degrading reliability of the package 100. This CTE mismatch can be reduced using a die attach 130 including a laser-submount junction 142. The laser-submount junction 142 comprises thin silicon or a thin aluminum nitride submounts between the laser diode 108 and the floor 122 of the conducting substrate 102. Solder 144, such as AuSn, connects each of the layers as shown in FIG. 8.

Figure 9A:
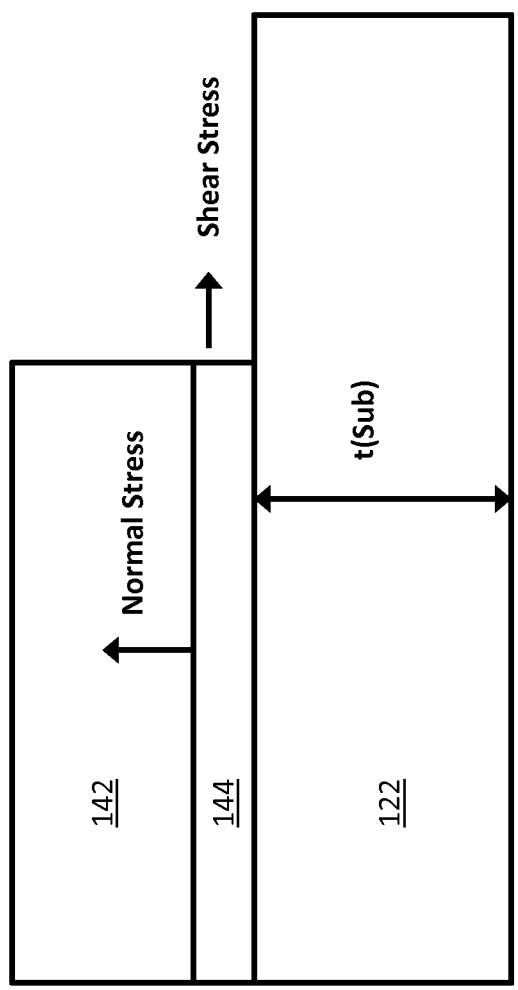
FIG. 9A is an enlarged cross-sectional side view of the die attach of FIG. 8.
Figure 9B:
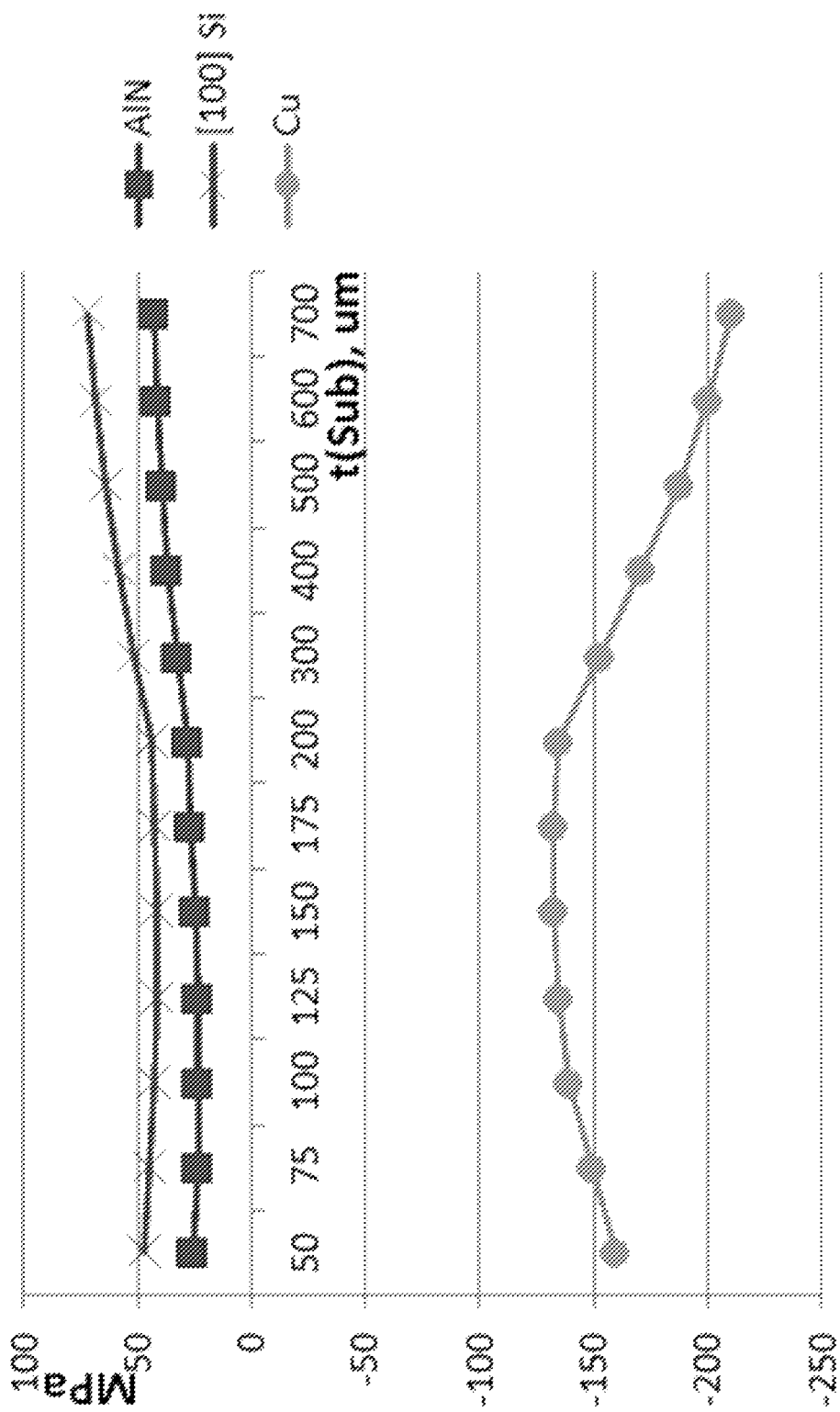
FIG. 9B is a graph of CTE stress for different die attach materials and thicknesses of conducting substrate in FIG. 9A.

FIG. 9A illustrates an enlarged cross-sectional side view of a portion of the die attach 130 of FIG. 8 and illustrates the normal stress in the submount 142 and shear stress in the solder 144 caused by CTE mismatch. The thickness t(Sub) of the floor 122 and the material of the submount 142 can be varied to decrease normal stress from CTE mismatch. FIG. 9B graphs the thickness t(Sub) of the floor 122 in micrometers against the normal stress in MPa for submounts 142 comprising AlN, [100] Si, and Cu. FIG. 9B shows that silicon submounts 142 thinner than 300 µm provide normal stress less than 50 MPa to avoid laser diode 108 failure.

Figure 10A:
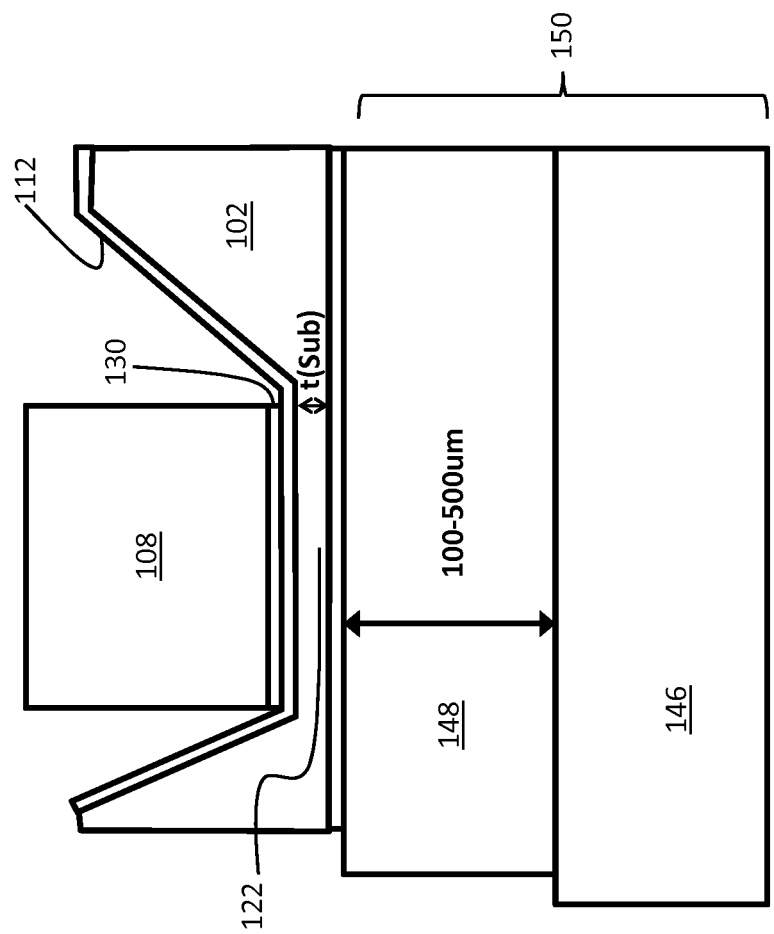
FIG. 10A is a cross-sectional side view of a thermal dissipate connected to a laser diode package according to the present disclosure.
Figure 10B:
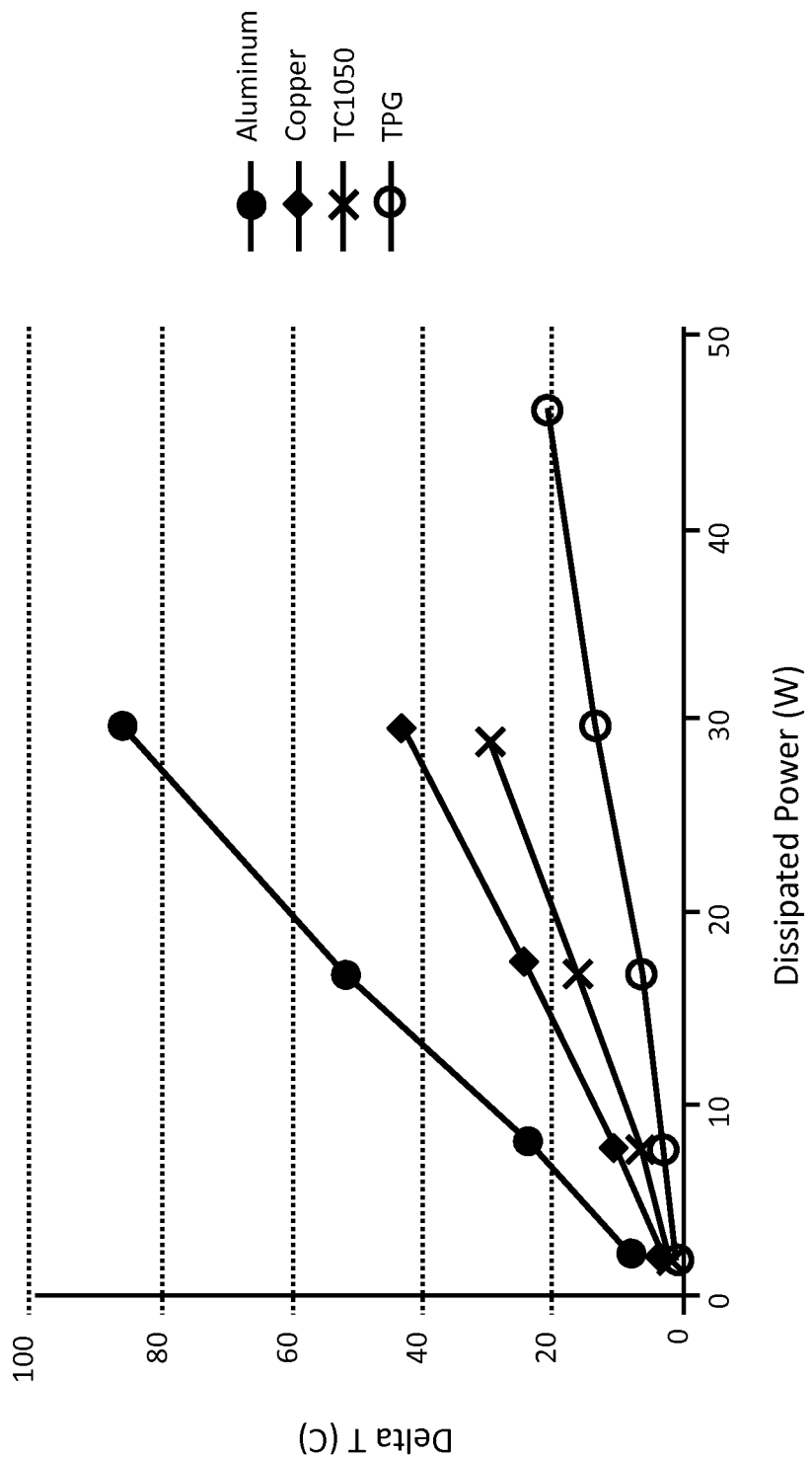
FIG. 10B is a graph of power dissipation of different thermal dissipate materials for different thicknesses in FIG. 10A.

FIG. 10A illustrates a cross-sectional side view of a thermal dissipate 150 connected to relevant portions of a laser diode package 100 according to the present disclosure to analyze heat dissipation. After singulation, the package 100 can be mounted on leadframe, or directly onto a printed circuit board 146. It can be further attached to copper or Thermal Pyrolitic Graphite (TPG) heat sinks 148. FIG. 10B graphs the dissipated power in watts for different temperature differences (Delta T) in Celsius for heat sinks 148 formed from Al, Cu, TC1050 and TGP.

Figure 11:
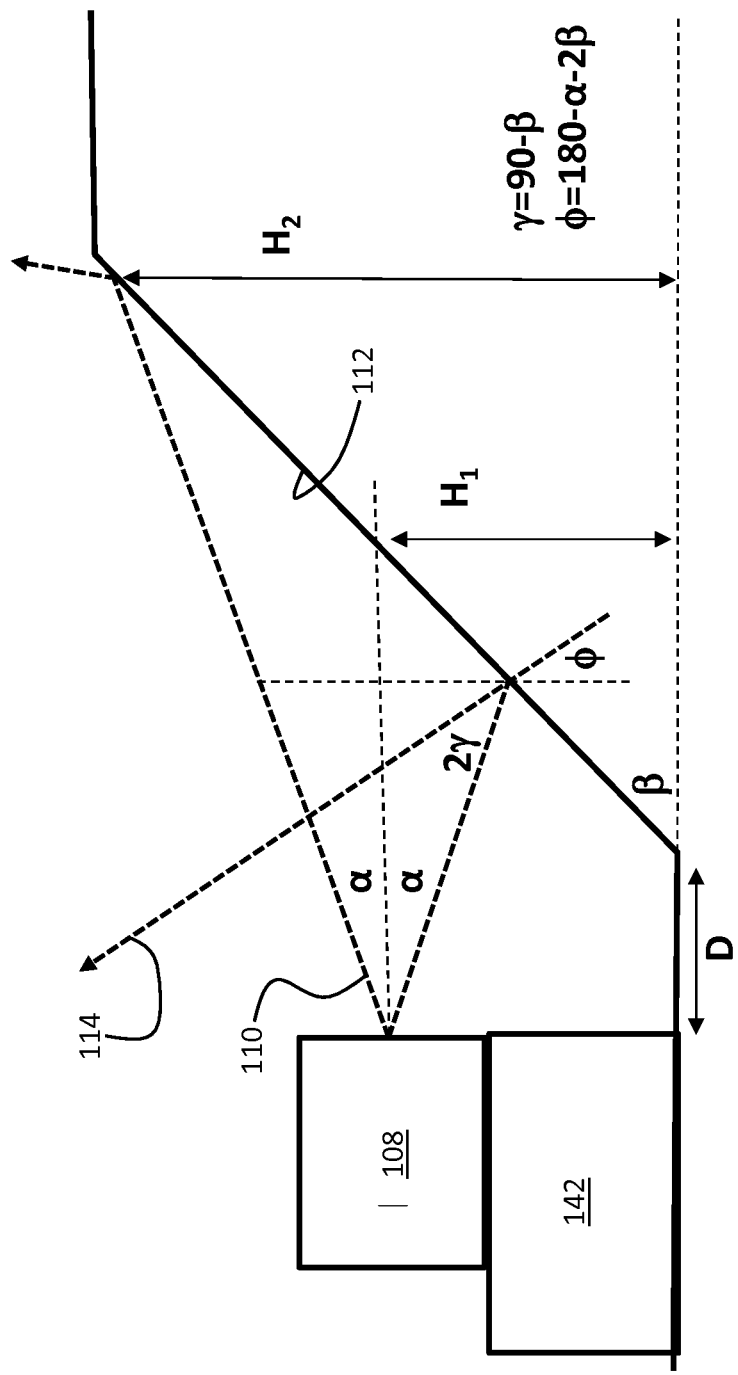
FIG. 11 is an enlarged cross-sectional side view of light paths between a laser diode and a reflector and minimum heights of components in a laser diode package according to the present disclosure.

Referring to FIG. 11, an enlarged cross-sectional side view of light paths between a laser diode 108 and a reflector 112, angular relationships of the light paths 110, 114 and components, and minimum heights of those components are illustrated. FIG. 11 shows the minimum recess depth ($H_2$) required for the reflective surface 112 in order to align the reflector 112 with the horizontal light path 110 accounting for the beam divergence angle ($\alpha$). The distance (D) between the emission point of the diode and the leading edge of the reflector is governed by alignment capability, damage threshold of the reflector material (for example 2000W/cm$^2$ for gold) and geometrical constraints to avoid the emitter 108 blocking the reflected light 114.

For a laser diode emitter 108 in p-side down configuration using a 100 µm AlN submount 142 and 150 µm diode 108 height, D should be greater than 223 µm. Using the same example with a p-side up configured emitter 108, D should be greater than 17 µm.

Where the beam divergence angle ($\alpha$) at FWHM is ±15°, the reflector 112 angle ($\beta$) is 54.7°, the diode-edge to mirror-edge distance (D) is 250 µm, and the horizontal light path 110 emission height ($H_1$) is 250 µm (comprising a 100 µm AlN submount 142 and a 150 µm diode 108, p-side up), $H_2$ has to be at least 390 µm. For the p-side down configuration, $H_2$ should be at least 205 µm.

A process for wafer-level fabrication of a laser diode package 100 will now be described making use of the package structure details already described above. All the fabrication discussed in the present disclosure is performed at "wafer scale" or wafer-level including the etching of the recesses, application of reflective media 112 (such as gold or silver), solder die attach, and vertical rings 106, for example, unless evidence to the contrary is provided.

A first substrate wafer 102 is provided having a plurality of recesses in a top surface. Each recess is defined by sidewalls 120 and a floor 122. The recesses, sidewalls 120 and floors 122 may be etched into the top surface of the first wafer 102 including controlling the slope of the sidewalls when etching to provide a diverse beam reflection angle for the reflector 112. A reflective coating 112 is applied to a portion of the sidewalls 120 of each recess. The reflective coating 112 may include polishing the sidewalls 120 for reflection of light or may involve depositing a reflective media.

An edge-emitting laser diode 108 is secured to the floor such that a horizontal light path 110 from each laser diode 108 is incident to the reflector 112 of its corresponding recess. The diode 108 may be attached to the floor 122 with a die attach 130 there between. The die attach 130 may include a junction 142 that is provided to reduce stress from CTE mismatch between the diode 108 and the floor 122.

The reflector 112 is angled so as to direct the light path 110 vertically 114. The reflector angling, which may be curved, may be provided by the angling of the sidewalls 120, by angling of the reflective surface 112 or by a combination of both.

A second substrate wafer 104 is provided having a bottom surface and comprising a diffusing optical element through the second wafer 104 for each recess. The diffusing optical element may comprise the entire second substrate 104 as in the case where the second substrate is an optically transparent substrate. Alternatively, the diffusing optical element may comprise a diffuser, lens or other optical feature disposed through a substrate to be aligned with the vertically turned light path 114. Where there is a large field of view, it may be impractical to provide a diffusing optical element rather than an optically transparent substrate. The diffusing optical element or the entire optically transparent substrate may include etched features, patterned polymer features or other features to assist light dispersion through the second wafer 104.

A vertical ring 106 is fabricated for each recess using wafer-level techniques. Fabrication of the vertical rings 106 occurs either on the first wafer's top surface directly surrounding each recess, or on the second wafer's bottom surface in a position such that when the wafers 102, 104 are combined, each vertical ring 106 surrounds its corresponding recess. The vertical ring 106 wafer-level fabrication methods were previously described.

Electrical connections 116, 118 are provided to each laser diode 108 from outside each vertical ring 106 for controlling the corresponding laser diode 108 of each package 100. In some embodiments, the electrical connections comprise some reasonable combination of providing wire bonds through adhesives 124 on an end of each vertical ring 106, providing wire bonds through a notch through each vertical ring 106, providing a metal feedthrough on or in the first wafer 102 for each laser diode, and providing electrical bond pads 126 on the first or second wafer then spanning each vertical ring 106 with a wire bond to each laser diode 108.

In some embodiments such as illustrated in FIGS. 1 and 3, bond pads 126 and electrical isolators 128 or metal feedthroughs of the electrical connections are fabricated in the first substrate 102 prior to forming the vertical ring 106 on the first substrate 102 such that the vertical rings 106 are formed on top of portions of the bond pads 126 and electrical isolators 128. In other embodiments such as in FIGS. 2 and 3, the electrical isolator 128 and the electrical pad 126 may be formed on the first substrate 102, then the vertical rings 106 are formed and finally wire bonds are attached.

After the first and second wafers 102, 104 have been prepared, the second wafer 104 is aligned and connected above the first wafer 102 using adhesive 124 or other bonding features such that each vertical ring 106 encloses its corresponding diffusing optical element and its corresponding recess and such that each vertically turned light path 114 is incident to the corresponding diffusing optical element. Connecting the wafers 102, 104 may occur, for example, by bonding or adhesion.

During or after connecting the first and second wafers 102, 104, and prior to singulation, the cavity of each package 100 containing its respective laser diode 108 may be hermetically sealed. Hermetic sealing can be achieved by using appropriate materials for the vertical rings 106, adhesives 124 and bonding methods as previously described for FIG. 7 and/or a sealing film 140 may be applied to the exterior vertical walls of the vertical ring 106 as previously described for FIG. 6. The film 140 may be applied to the connected wafer pair through through-holes 136 in the first or second wafer 102, 104 between adjacent vertical rings 106 then directionally etching the film 140 leaving a layer on the exterior walls of the vertical rings 106.

After bonding the wafers 102, 104, the packages 100 are separated or singulated by cutting the connected wafer pair between adjacent recesses. Double dicing may be applied to first cut open the second wafer 104 between adjacent vertical rings 106 using a wide blade to get access to the electrical pads 126, and then singulating the packages 100 using a narrow blade to cut through the first substrate 102.

Double dicing may include separating packages by cutting a first opening 150 in the second wafer 104 then cutting a smaller second opening 160 in the first wafer 102 through the first opening. This is illustrated in FIG. 2 where a cross-sectional side view of a cutting procedure for a multi-layer wafer of laser diode packages is illustrated. A first cut 150 through the second wafer 104 provides a wide opening through which the electrical bond pad 126 may be accessed. A second cut 160 through the first wafer 102 may be made by access through the first cut 150. The second cut 160 will cut a smaller opening than the first cut.

Cutting a silicon wafer 102 can be achieved using a thin blade (such as 2 or 3 mil), while cutting a glass wafer 104 requires slow speeds and wide blades (such as 6, 8, or 10 mil). Double dicing may cause stress and delamination of the bond between vertical rings 106 and the wafer bonded to the vertical rings 106. To reduce the risk of delamination, the second wafer 104 may include through-holes 136 (illustrated in FIG. 5) to reduce the amount of cutting necessary, and/or reduced thickness regions be opened up by backgrinding in addition to, or instead of, cutting.

Through-holes 136 and/or thinned wafer portions may also be generated in either wafer 102, 104 between adjacent vertical rings 106 to assist with package singulation.

Referring to FIG. 4, a cross-sectional side view of a symmetric laser diode package 100' according to the present disclosure is illustrated. The symmetric package 100' includes a dual-edge-emitter diode laser 108' where multiple horizontal light paths 110a, 110b are emitted to reflect from two symmetric 54.7° reflector mirrors 112a, 112b at each sidewall of the recess to provide larger field of view for the package 100.

The second horizontal light path 110b may be opposite in horizontal direction to the horizontal light path 100a. The second horizontal light path 110b will be incident to a second portion of the conducting substrate's sidewalls 120. The second sidewall portion may have an opposite slope relative to the slope of the first sidewall portion and include a second reflective surface 112b for directing the second light path 110b vertically 114b through the optically transparent substrate 104. The symmetric package 100' may provide an increased field of view.

In the present disclosure, pairs of directional terms such as horizontal and vertical, top and bottom, and above and below are to be understood in their relative context and are otherwise orientation independent unless there is evidence to the contrary. For example, a package structure or process according to the present disclosure could be rotated vertically thus providing a low horizontal profile package emitting a horizontally diffuse light from the package. However, one skilled in the art would readily understand that this package still uses an edge-emitting laser diode rather than a vertical cavity surface-emitting laser diode.

Where any components, elements and features described in the present disclosure have been described in some way as connected to other components, elements and features, it is to be understood that such connection includes direct connections, connections through transmission media (wired and wireless) and indirect connections through any other components unless the present disclosure specifically indicates otherwise.

Where examples, alternative embodiments and additional aspects of those embodiments have been described in the present disclosure, those examples, embodiments and aspects may be combined in any manner within a single embodiment unless the present disclosure suggests otherwise.

Where any claim enumerates elements or actions (alphabetically, numerically or otherwise), these enumerations are provided for identification purposes only and do not imply any order of actions. The order of actions in a claim having enumerated actions (alphabetically, numerically, or otherwise) is determined by the language of the claims as informed by the specification, and not by the enumeration order of those actions.

The invention claimed is:

1. A process comprising:
   (a) providing a first substrate wafer having a recess in a top surface defined by sidewalls and a floor;
   (b) applying a reflector to a portion of the sidewalls;
   (c) attaching an edge-emitting diode to the floor such that a horizontal light path from the diode will be incident to the reflector, which directs the light path vertically;
   (d) providing a second substrate wafer having a bottom surface and comprising an optically diffusing media;
   (e) fabricating a vertical ring on one of the first substrate wafer's top surface surrounding the recess and the second substrate wafer's bottom surface in a position to surround the recess, wherein (e) comprises fabricating the vertical ring from a polymer material by:
      (e1) applying a layer of polymer material to one of the bottom surface of the second substrate wafer or the top surface of the first substrate wafer by spin coating, spray coating, or laminating, followed by patterning the layer of polymer material to form the vertical ring therefrom, or
      (e2) bonding a pre-molded structure to the bottom surface of the second substrate wafer or the top surface of the first substrate wafer with an adhesive;
   (f) providing an electrical connection to the diode from outside the vertical ring for controlling the diode; and
   (g) after (a) through (f), connecting the second substrate wafer above the first substrate wafer such that the vertical ring encloses the optically diffusing media and the recess and such that the vertically turned light path is incident to the optically diffusing media.

2. The process of claim 1 wherein (a) further comprises etching the recess, sidewalls and floor into the top surface of the first substrate wafer and controlling the slope of the sidewalls for angling the reflector.

3. The process of claim 1 wherein (c) further comprises providing a junction between the diode and the floor to reduce stress from a difference in CTE between the diode and the floor.

4. The process of claim 3 wherein providing a junction comprises providing a silicon submount thinner than 300 um.

5. The process of claim 1 wherein providing a second substrate wafer comprises providing an optically transparent substrate wafer having etched or patterned polymer features.

6. The process of claim 1 wherein (e) further comprises fabricating the vertical ring by any of evaporation, sputtering, plating, molding, screen printing, spin or spray coating, chemical vapor deposition, epitaxy, laminating, dispensing and selective crystallographic etching.

7. The process of claim 1 further comprising hermetically sealing the cavity defined between the first and second substrate wafers containing the diode.

8. The process of claim 7 wherein hermetically sealing the cavity further comprises after (g), applying a film to the connected substrate wafers then directionally etching the film leaving a layer on the exterior walls of the vertical rings.

9. A method comprising:
   (a) providing a first substrate wafer having a plurality of recesses in a top surface, each recess defined by sidewalls and a floor;
   (b) applying a reflector to a portion of the sidewalls of each recess;
   (c) securing an edge-emission diode to each floor such that a horizontal light path from each diode is incident to its corresponding recess's reflector, which directs the light path vertically;
   (d) providing a second substrate wafer having a bottom surface and comprising an optically diffusing media;
   (e) fabricating a different vertical ring for each recess on the second substrate wafer's bottom surface in a position to surround its corresponding recess;
   (f) providing an electrical connection to each diode from outside the vertical ring for controlling the diode;
   (g) after (a) through (f), connecting the second substrate wafer, said second substrate wafer comprising a plurality of the vertical rings on the bottom surface thereof, above the first substrate wafer such that each of the vertical rings encloses a single one of the edge emitting diodes in its corresponding recess and such that each vertically turned light path is incident to its corresponding diffusing optical media, so as to form connected substrate wafers comprising a plurality of packages wherein each of the plurality of packages contains one of the edge-emission diodes;
   (h) and after (g), separating the packages by cutting the connected substrate wafers between the recesses.

10. The method of claim 9 wherein (a) further comprises etching the recess, sidewalls and floor into the top surface of the first substrate wafer and controlling the slope of the sidewalls for angling the reflector.

11. The method of claim 9 wherein (c) further comprises providing a junction between the diode and the floor to reduce stress from a difference in CTE between the diode and the floor.

12. The method of claim 11 wherein providing a junction comprises providing a silicon submount thinner than 300 um.

13. The method of claim 9 wherein providing a second substrate wafer comprises providing an optically transparent substrate wafer having etched or patterned polymer features.

14. The method of claim 9 wherein (d) further comprises providing holes or reduced-thickness sections between adjacent vertical rings in at least one of the first and second substrate wafers to assist (h).

15. The method of claim 9 wherein (e) further comprises fabricating the vertical rings by any of evaporation, sputtering, plating, molding, screen printing, spin or spray coating, chemical vapor deposition, epitaxy, laminating, dispensing and selective crystallographic etching.

16. The method of claim 9 further comprising, prior to (h), hermetically sealing the cavities defined between the first and second wafers containing each diode.

17. The method of claim 9 wherein (h) further comprises double dicing to separate packages by cutting a first opening in the second substrate wafer then cutting a smaller opening in the first substrate wafer through the first opening.

18. The method of claim 9, wherein (e) comprises fabricating the vertical rings from a polymer material by: (e1) applying a layer of polymer material to the bottom surface of the second substrate by spin coating, spray coating, or laminating, and (e2) patterning the layer of polymer material to form the vertical rings therefrom.

19. The method of claim 9, wherein (e) comprises bonding a pre-fabricated structure to the bottom surface of the second substrate wafer.

20. The method of claim 9, wherein providing a second substrate wafer comprises providing an optically diffusing glass wafer.

21. A method comprising:
  (a) providing a first substrate wafer having a plurality of recesses in a top surface, each recess defined by sidewalls and a floor;
  (b) applying a reflector to a portion of the sidewalls of each recess;
  (c) securing an edge-emission diode to each floor such that a horizontal light path from each diode is incident to its corresponding recess's reflector, which directs the light path vertically;
  (d) providing a second substrate wafer having a bottom surface and comprising an optically diffusing media;
  (e) fabricating a vertical ring for each recess on one of the first substrate wafer's top surface surrounding its corresponding recess and the second substrate wafer's bottom surface in a position to surround its corresponding recess;
  (f) providing an electrical connection to each diode from outside the vertical ring for controlling the diode;
  (g) after (a) through (f), connecting the second substrate wafer above the first substrate wafer such that each vertical ring encloses its corresponding diffusing optical media and its corresponding recess so as to form a cavity containing one of the edge emitting diodes, and so that each vertically turned light path is incident to its corresponding diffusing optical media; and
  (h) after (g), separating packages by cutting the connected substrate wafers between the recesses;
  (i) after (g) and prior to (h), applying a film to the connected substrate wafers through through-holes in the first or second substrate wafer between adjacent vertical rings then directionally etching the film leaving a layer on the exterior walls of the vertical rings for hermetically sealing the cavities.

* * * * *